United States Patent
Yu et al.

(10) Patent No.: US 10,950,572 B2
(45) Date of Patent: Mar. 16, 2021

(54) DIE BONDER AND METHODS OF USING THE SAME

(71) Applicant: Taiwan Semiconductor Manufacturing Company, Ltd., Hsinchu (TW)

(72) Inventors: Chen-Hua Yu, Hsinchu (TW); Shing-Chao Chen, Zhubei (TW); Chung-Shi Liu, Hsinchu (TW); Ming-Da Cheng, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/669,819

(22) Filed: Oct. 31, 2019

(65) Prior Publication Data

US 2020/0066673 A1 Feb. 27, 2020

Related U.S. Application Data

(62) Division of application No. 14/686,142, filed on Apr. 14, 2015, now Pat. No. 10,475,764.

(60) Provisional application No. 62/096,979, filed on Dec. 26, 2014.

(51) Int. Cl.
| | |
|---|---|
| *H01L 23/00* | (2006.01) |
| *H01L 21/67* | (2006.01) |
| *B32B 37/02* | (2006.01) |
| *B32B 38/18* | (2006.01) |
| *H01L 21/56* | (2006.01) |

(52) U.S. Cl.
CPC .............. *H01L 24/80* (2013.01); *B32B 37/02* (2013.01); *H01L 21/67144* (2013.01); *H01L 24/19* (2013.01); *B32B 2038/1891* (2013.01); *B32B 2457/14* (2013.01); *H01L 21/568* (2013.01); *H01L 2224/04105* (2013.01); *H01L 2224/12105* (2013.01); *H01L 2224/18* (2013.01); *H01L 2924/10252* (2013.01); *H01L 2924/10253* (2013.01); *H01L 2924/10271* (2013.01); *H01L 2924/1203* (2013.01); *H01L 2924/1304* (2013.01); *H01L 2924/18162* (2013.01)

(58) Field of Classification Search
CPC ...................................................... H01L 24/80
See application file for complete search history.

(56) References Cited

U.S. PATENT DOCUMENTS

| | | | |
|---|---|---|---|
| 6,142,356 A | 11/2000 | Yamazaki et al. | |
| 6,517,656 B1 * | 2/2003 | DiCaprio | H01L 24/75 156/235 |
| 9,245,787 B2 | 1/2016 | Jeon et al. | |
| 9,312,148 B2 | 4/2016 | Lin et al. | |

(Continued)

FOREIGN PATENT DOCUMENTS

| | | |
|---|---|---|
| CN | 1235371 A | 11/1999 |
| CN | 1551323 A | 12/2004 |

(Continued)

*Primary Examiner* — Mohammad M Choudhry
(74) *Attorney, Agent, or Firm* — Slater Matsil, LLP

(57) ABSTRACT

A method includes bringing into contact respective first sides of a plurality of dies and a die attach film on a major surface of a carrier wafer, and simultaneously heating portions of the die attach film contacting the plurality of dies in order to simultaneously bond the plurality of dies to the die attach film.

20 Claims, 21 Drawing Sheets

(56) References Cited

U.S. PATENT DOCUMENTS

| | | | |
|---|---|---|---|
| 2002/0040768 A1 | 4/2002 | Sagar et al. | |
| 2003/0036249 A1* | 2/2003 | Bauer | H01L 21/67092 438/460 |
| 2005/0026326 A1 | 2/2005 | Kiritani et al. | |
| 2006/0121644 A1* | 6/2006 | Hsu | H01L 24/27 438/106 |
| 2006/0264006 A1* | 11/2006 | Kian | H01L 24/83 438/464 |
| 2007/0224733 A1* | 9/2007 | Boyle | H01L 21/6836 438/118 |
| 2008/0122119 A1 | 5/2008 | Kian et al. | |
| 2010/0043224 A1* | 2/2010 | Burke | B41J 2/16 29/854 |
| 2010/0047962 A1 | 2/2010 | Burke et al. | |
| 2012/0038034 A1 | 2/2012 | Shin et al. | |
| 2013/0001776 A1 | 1/2013 | Yu et al. | |
| 2013/0062760 A1* | 3/2013 | Hung | H01L 21/561 257/738 |
| 2013/0183831 A1* | 7/2013 | Yu | H01L 21/67115 438/758 |
| 2013/0307143 A1 | 11/2013 | Lin et al. | |
| 2015/0332995 A1 | 11/2015 | Goh et al. | |

FOREIGN PATENT DOCUMENTS

| | | |
|---|---|---|
| CN | 103187388 A | 7/2013 |
| CN | 103903974 A | 7/2014 |
| KR | 20070095636 A | 10/2007 |
| KR | 20100093857 A | 8/2010 |
| KR | 20120137859 A | 12/2012 |
| KR | 20140086361 A | 7/2014 |

* cited by examiner

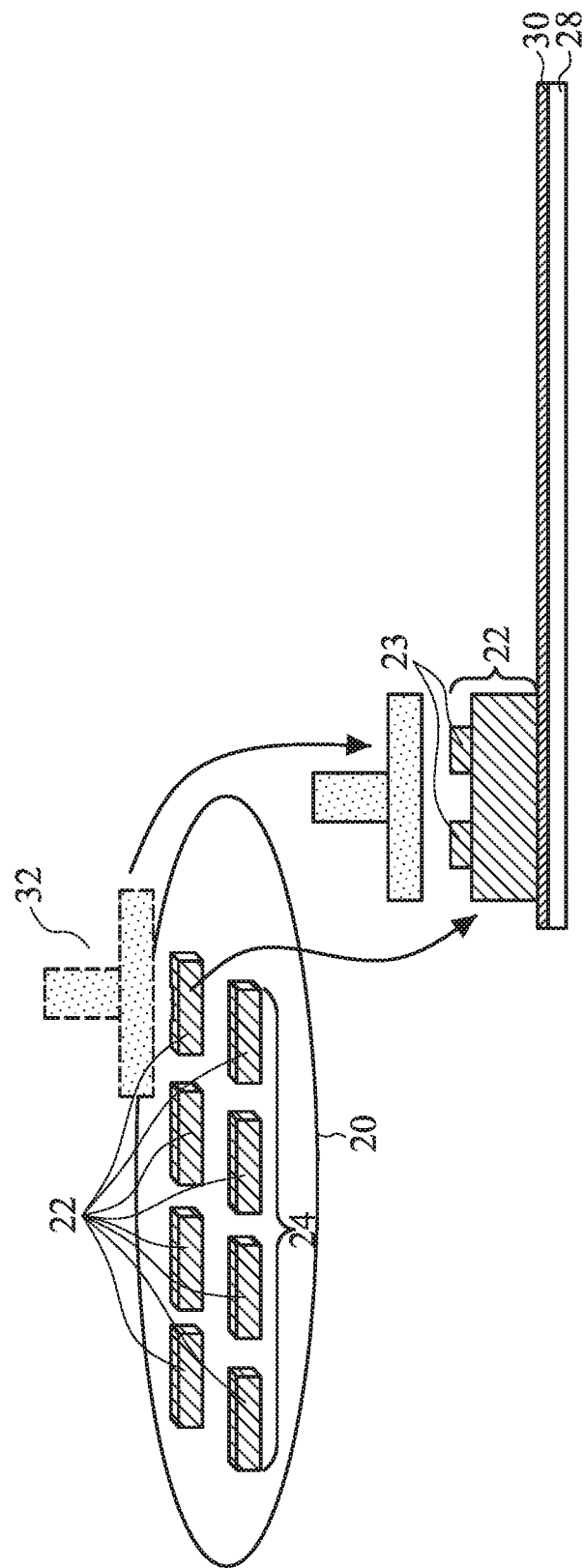

DIE BONDER AND METHODS OF USING THE SAME

PRIORITY CLAIM AND CROSS-REFERENCE

This application is a divisional of U.S. patent application Ser. No. 14/686,142, entitled "Die Bonder and Methods of Using the Same," filed on Apr. 14, 2015, which claims the benefit of U.S. Provisional Application No. 62/096,979 filed Dec. 26, 2014, and entitled "Die Bonder and Methods of Using the Same," which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
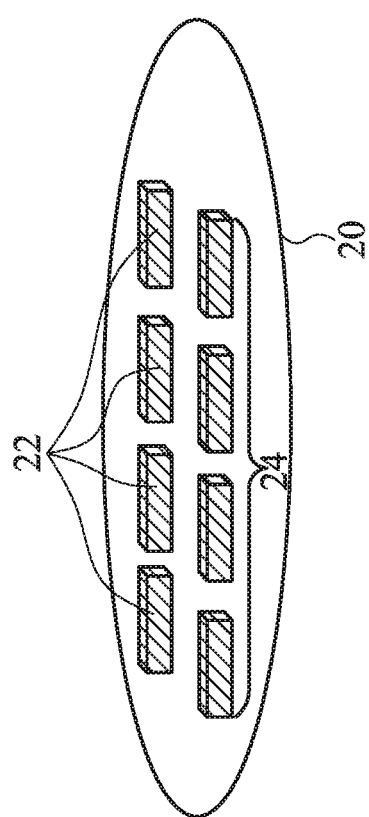
FIGS. 1 through 5 illustrate the cross-sectional views of intermediate stages in the bonding of dies to a die attach film in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A bonder design and the methods of using the bonder to bond dies onto Die Attach Films (DAFs) are provided in accordance with various exemplary embodiments. The intermediate stages of forming a package based on the dies bonded onto the DAFs are illustrated. The variations of the embodiments are discussed. Throughout the various views and illustrative embodiments, like reference numbers are used to designate like elements.

Figure 20:
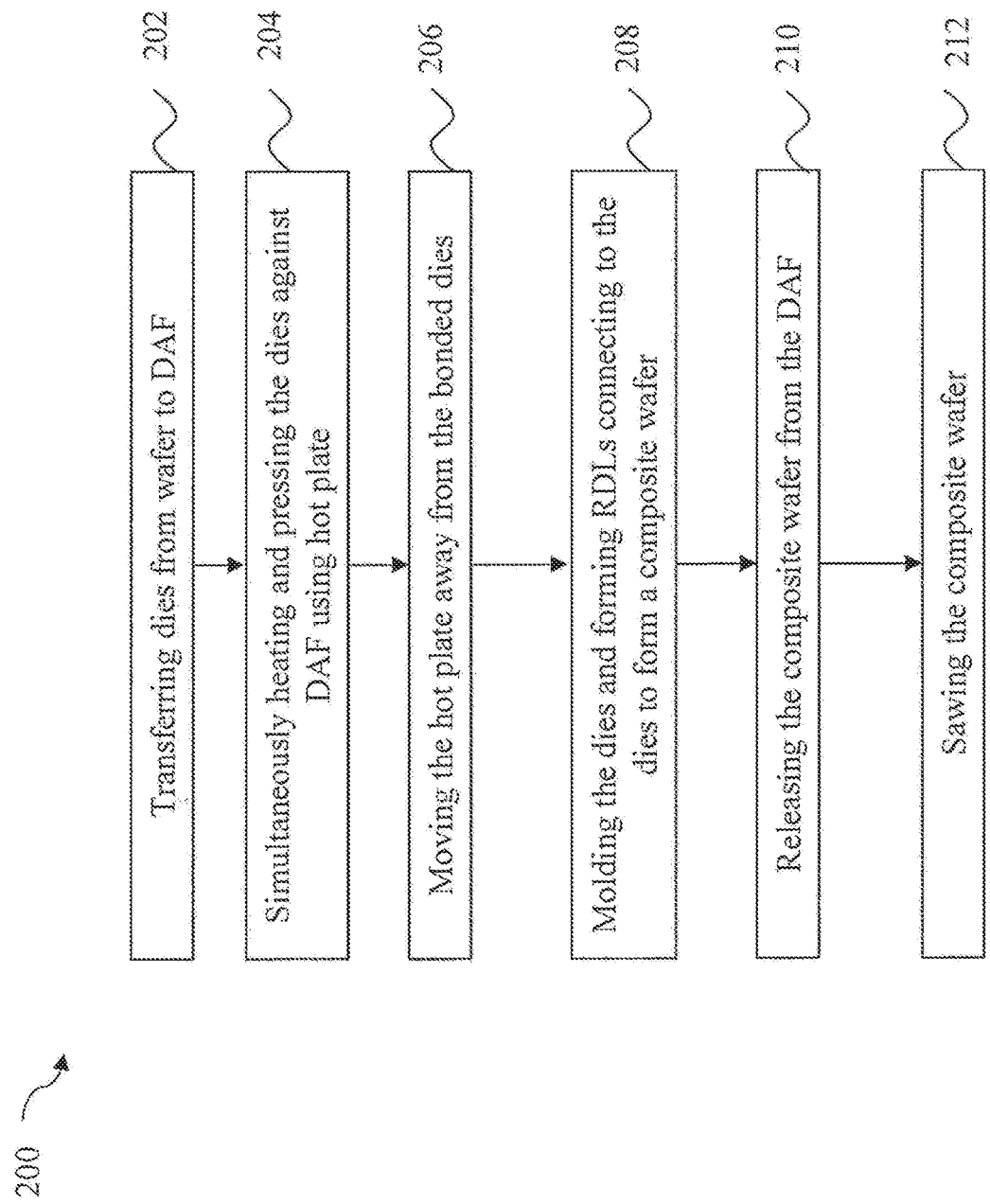
FIG. 20 illustrates a process flow in the formation of a fan-out package in accordance with some embodiments.

FIGS. 1 through 7 illustrate the cross-sectional views of intermediate stages in the formation of a fan-out package in accordance with some embodiments. The steps shown in FIGS. 1 through 7 are also illustrated schematically in the process flow 200 shown in FIG. 20. In the subsequent discussion, the process steps shown in FIGS. 1 through 7 are discussed referring to the process steps in FIG. 20.

Figure 8:
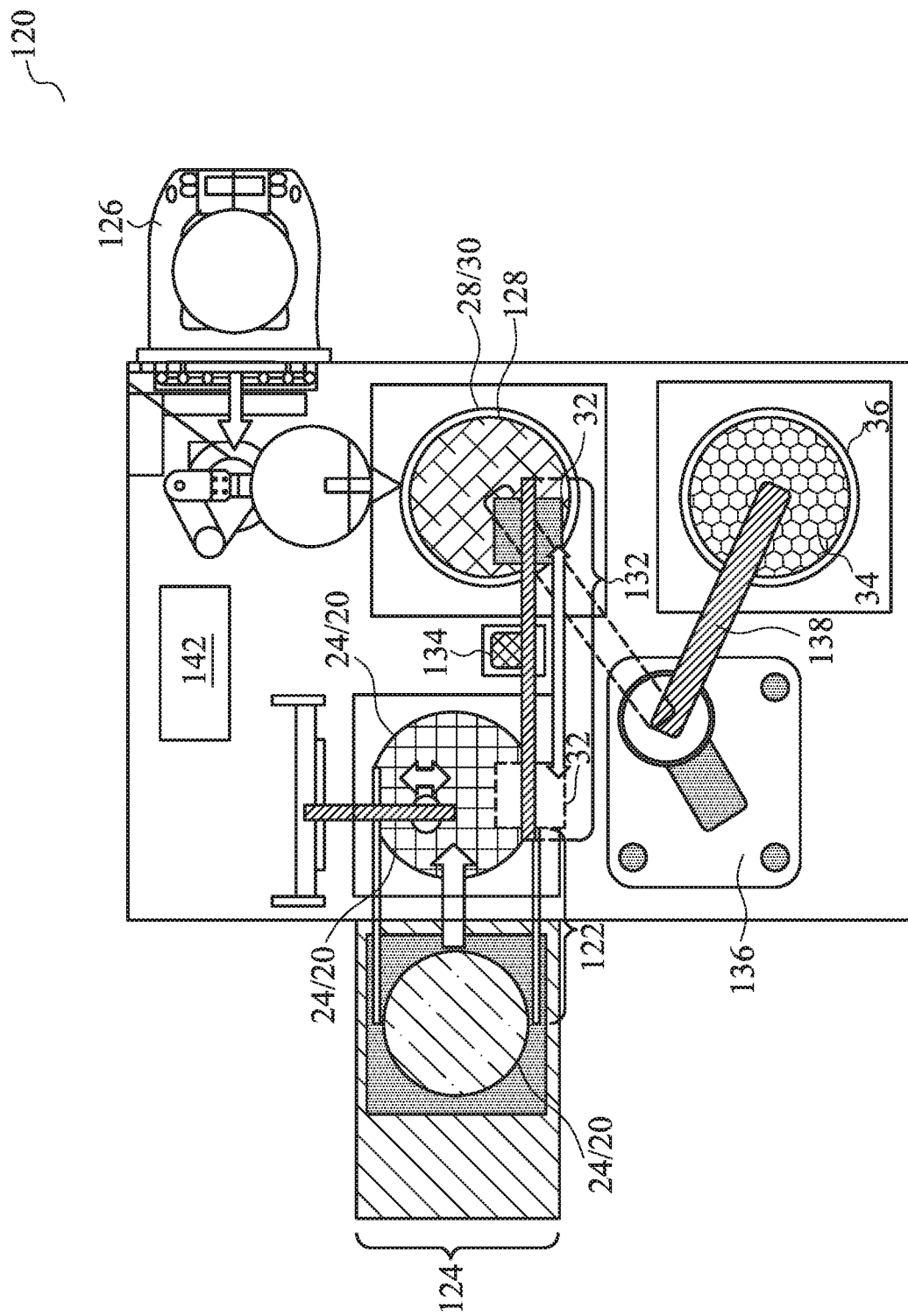
FIG. 8 illustrates a bonder design in accordance with some embodiments.

Referring to FIG. 1, sawed wafer 24 is attached to dicing tape 20, which is used to adhere to the discrete dies 22 in wafer 24. In accordance with some embodiments of the present disclosure, dies 22 include integrated circuit devices such as transistors, diodes, resistors, capacitors (not shown), and/or the like. Dies 22 may include a semiconductor substrate (not marked) such as a silicon substrate, a III-V compound semiconductor substrate, a germanium substrate, a silicon germanium substrate, or the like. It is appreciated that although dies 22 are illustrated as separated far away from each other for clarity, dies 22 are actually closely located from each other, with kerves generated in the die-sawing process to separate dies 22 from each other. Furthermore, wafer 24 is a round wafer viewed from top, as shown in FIG. 8.

Figure 2A:
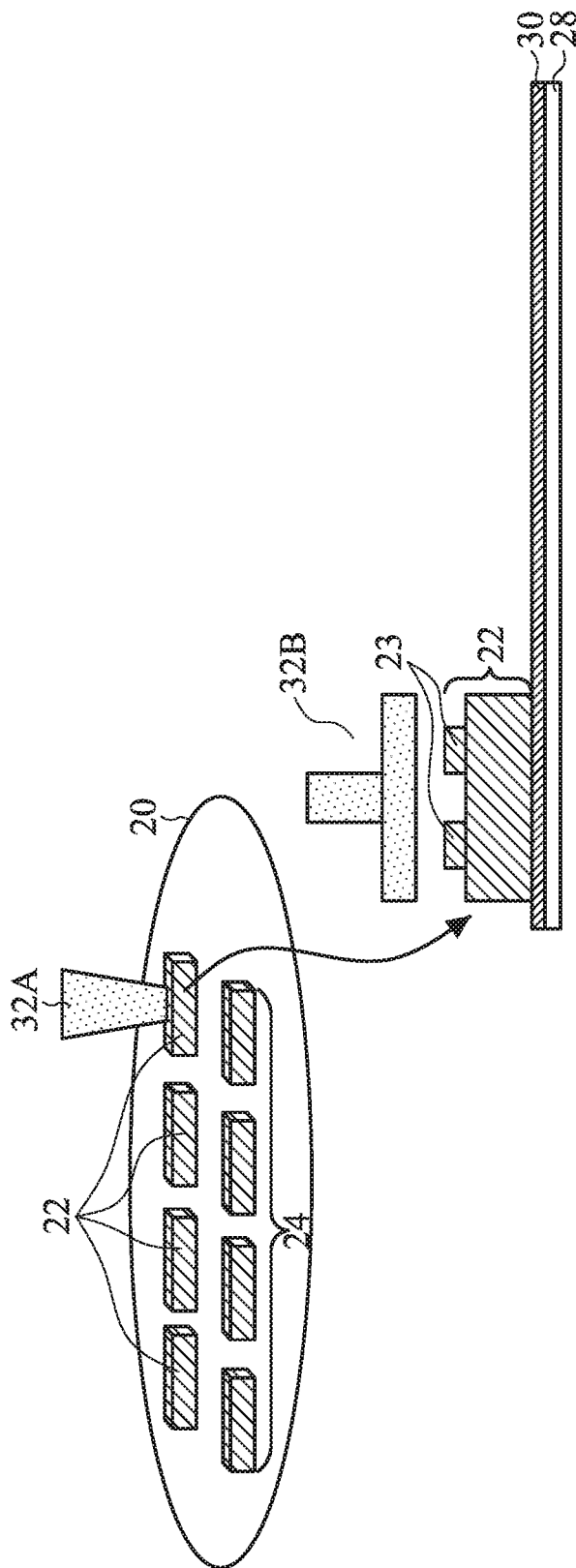

Referring to FIG. 2A, dies 22 are picked up from dicing tape 20 and transferred over carrier wafer 28 and the overlying DAF 30. The respective step is illustrated as step 202 in the process flow 200 shown in FIG. 20. In accordance with some embodiments of the present disclosure, carrier wafer 28 is a glass carrier wafer, or may be formed of other transparent materials, which may be transparent to, for example Ultra Violet (UV) light. Other material such as organic materials, ceramics, or the like, may also be used. DAF 30 is attached to carrier wafer 28, and may be formed/attached, for example, through lamination or coating. DAF 30 has the characteristic that when heated, becomes sticky enough, and hence dies 22 may be adhered thereon, as will be discussed in subsequent paragraphs. Carrier wafer 28 and DAF 30 may have a top view of a typical wafer, for example, with a round top-view shape. In some exemplary embodiments, DAF 30 is formed of a Light To Heat Conversion (LTHC) material.

As shown in FIG. 2A, die 22 is picked up by pickup head 32A, which may be a vacuum head that is capable of picking up die 22 through vacuum. In accordance with some embodiments of the present disclosure, vacuum head 32A is not heated (and may not be cooled either). Accordingly, vacuum head 32A has a temperature equal to the ambient temperature of the surrounding environment (such as the internal environment of bonder 120 as illustrated in FIG. 8) in which wafer 24 is located. For example, the temperature of vacuum head 32A may be equal to room temperature, which may be in the range between about 18° C. and about 25° C. Furthermore, the temperature of vacuum head 32A may be close to the temperature of wafer 24, for example, with the difference between the temperatures of vacuum head 32A and wafer 24 being smaller than about 5° C.

In accordance with some embodiments of the present disclosure, the picked up die 22 is handed off to placement head 32B, which is also able to suck up die 22 through vacuum. In accordance with some embodiments of the present disclosure, placement head 32B is heated to a temperature higher than the ambient temperature of the environment in which wafer 24 is located. For example, the temperature of placement head 32B may be higher than the temperatures of wafer 24 and the ambient temperature by a difference greater than about 25 degrees. In accordance with some embodiments of the present disclosure, the temperature of placement head 32B is in the range between about 50° C. and about 200° c.

In accordance with alternative embodiments of the present disclosure, placement head 32B is not heated (and may not be cooled either). Accordingly, the temperature of placement head 32B is equal to the ambient temperature of the environment in which wafer 24 is located, and may be close to the temperature of wafer 24, for example, with the difference between the temperatures of vacuum head 32A and wafer 24 being smaller than about 5° C.

Placement head 32B is used to place die 22 onto DAF 30, as shown in FIG. 2A. In accordance with some embodiments, a low pressure is applied to press die 22 against DAF 30. In accordance with alternative embodiments, die 22 is placed on DAF 30 with no pressure applied. The position of die 22 is determined through an alignment process, and hence die 22 is placed accurately to the desirable position. Throughout the description, pickup head 32A and placement head 32B are collectively referred to as pick and place head(s) 32.

FIG. 2B illustrates the pick and place of die 22 in accordance with alternative embodiments, in which a same pick and place head 32 is used to pick up die 22 from dicing tape 20 and place die 22 onto DAF 30. Accordingly, no hand off is conducted during the transferring of die 22 from dicing tape 20 to DAF 30. In these embodiments, pick and place head 32 is not heated. For example, pick and place head 32 may have the room temperature.

In accordance with some embodiments of the present disclosure, die 22 is placed facing up. For example, electrical connectors 23 are schematically illustrated, with the side with the electrical connectors 23 being the front side, which faces up. Electrical connectors 23 may be metal pillars, solder regions, metal pads, or other conductive features. The opposite side (the side in contact with DAF 30) is the backside of die 22. In some embodiments, the backside of die 22 is also the backside of the semiconductor substrate (not shown) in die 22, on which integrated circuit devices are formed. Accordingly, in some embodiments, the backside of the semiconductor substrate is in physical contact with DAF 30.

Figure 3:
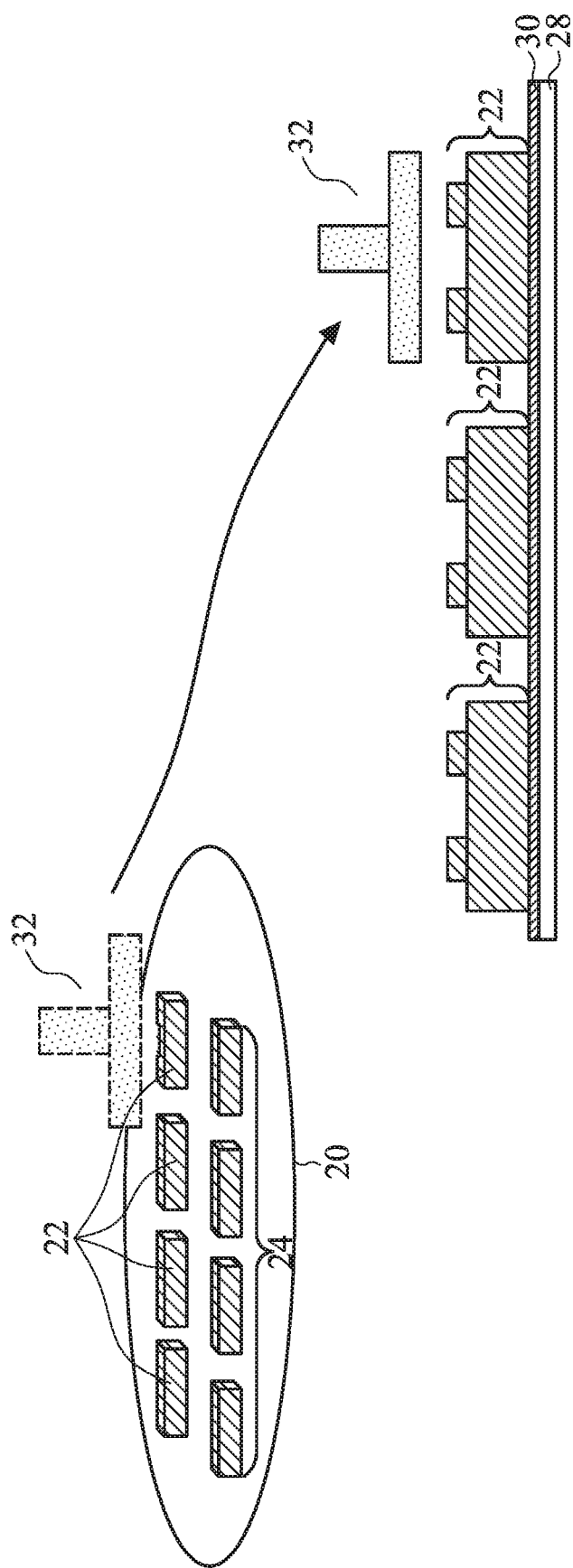

Next, referring to FIG. 3, the process steps as shown in FIGS. 1 and 2A (or FIGS. 1 and 2B) are repeated, and more dies 22 are transferred onto DAF 30. The process is continued until all locations over DAF 30 that are intended to be placed with dies are placed. In the placement of dies 22, dies 22 are placed with or without pressure applied to press dies 22 against DAF 30. Furthermore, during and between the pick and place of dies 22, there is no additional heating process applied onto carrier wafer 28, DAF 30, and dies 22. Accordingly, after all dies 22 are placed, dies 22 are placed over, but are not adhered to, DAF 30.

Figure 4:
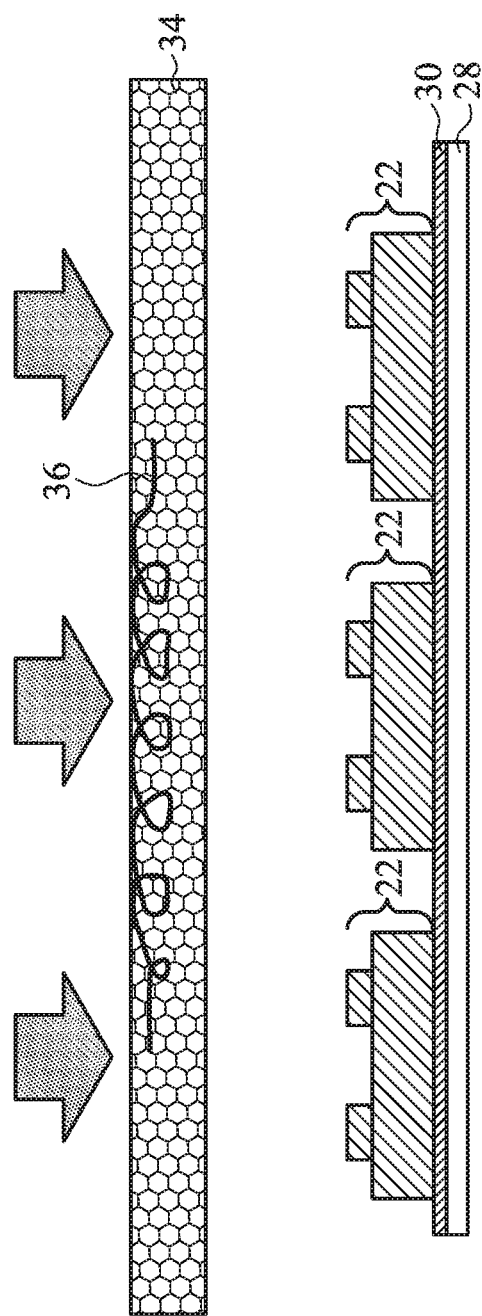
Figure 5:
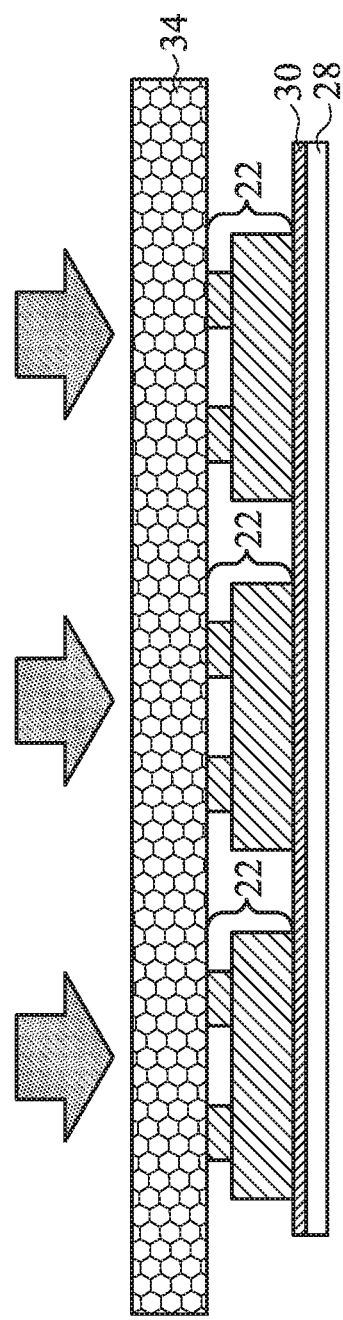

FIGS. 4 and 5 illustrate the process for heating dies 22 and pressing dies 22 against DAF 30, so that dies 22 are adhered to DAF 30 by a sticking force. The respective step is illustrated as step 204 in the process flow 200 shown in FIG. 20. Referring to FIG. 4, hot plate 34 is moved to the top of dies 22. Hot plate 34 may be formed of a metal or a metal alloy including copper, aluminum, stainless steel, nickel, or the like. Hot plate 34 may also be formed of other materials such as ceramic. The bottom surface of hot plate 34 is coplanar, and may be the surface of the same material such as the same metal or metal alloy. Heating unit 36 is schematically illustrated. In accordance with some embodiments of the present disclosure, heating unit 36 comprises a coil that when conducted with an electrical current, heats hot plate 34 to a desirable temperature. Heating unit 36 may be embedded in hot plate 34. Alternatively, heating unit 36 may be placed over hot plate 34. In accordance with some embodiments, the temperature of hot plate 34 is increased to higher than about 50° C., and may be in the range between about 50° C. and about 200° C.

Next, referring to FIG. 5, hot plate 34 is brought into contact with dies 22. Dies 22 are thus heated by hot plate 34. In addition, a pressure (represented by arrows) is applied to press dies 22 against DAF 30. Heat is conducted through dies 22 and reaches the bottom surfaces of dies 22, which are in contact with DAF 30, and hence the portions of DAF film 30 directly underlying dies 22 are heated and become adhesive. The bottom surfaces of dies 22 may be heated to a temperature higher than about 50° C. The temperature may also be in the range between about 50° C. and about 200° C.

Hot plate 34 is pressed against dies 22 for a certain period of time, for example, longer than about 0.5 seconds, or in the range between about 0.5 seconds and about 2 seconds. The temperature and the period of time are related to various factors including, and not limited to, the thickness of dies 22, the material and structure of dies 22, the material of DAF 30, and the like. The optimum temperature and the optimum period of time are selected to ensure that dies 22 are reliably adhered to DAF 30. Throughout the description, the adhering of dies 22 to DAF 30 is referred to as the bonding of dies 22 to DAF 30, and the respective heating and pressing process are referred to as a bonding process.

After dies 22 are bonded to DAF 30, hot plate 34 is lifted up and moved away. The respective step is illustrated as step 206 in the process flow 200 shown in FIG. 20. In accordance with some embodiments of the present disclosure, the above-discussed bonding of dies 22 includes two phases. In the first phase, dies 22 are placed onto DAF 30, wherein no bonding process is performed to bond dies 22 to DAF 30, until all dies 22 are placed. In the second phase, a hot plate is used to simultaneously bond all dies 22 to DAF 30 through the heating and the pressing of dies 22 simultaneously. Accordingly, a single bonding process is shared by all dies 22 regardless of the count of dies 22 on carrier wafer 28. The throughput of the bonding process is thus very high. As a comparison, in conventional bonding process, each of dies is picked up and placed on the respective DAF, followed by a heating and pressing process, until the die is bonded to the DAF. Therefore, the bonding time is proportional to the count of the dies. For example, assuming more than a thousand dies are bonded, with the bonding of each die taking one second, the total time for bonding all dies will be longer than 1,000 seconds.

In addition, with hot plate 34 having a coplanar bottom surface, after the bonding of dies 22 onto DAF 30, the top surfaces of dies 22 are highly coplanar with each other, which results in the reduction in the process difficulty in the formation of the subsequently performed fan-out process.

Figure 6:
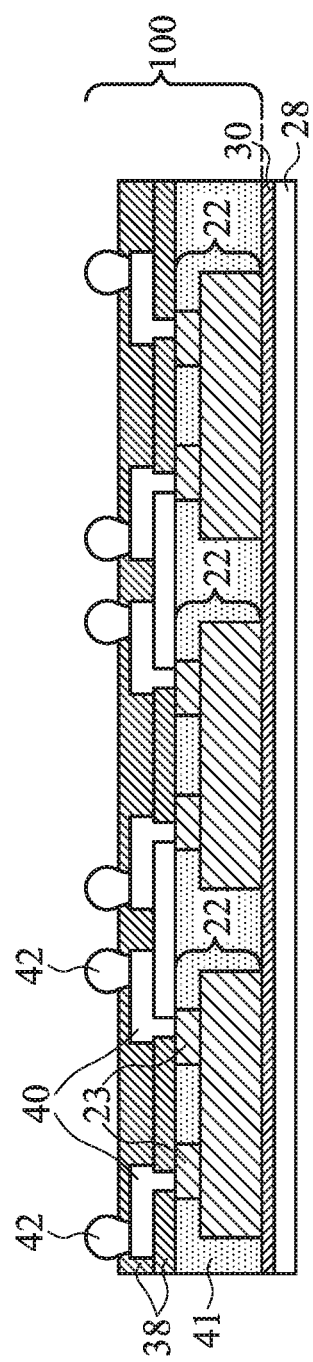
FIGS. 6 and 7 illustrate the cross-sectional views of intermediate stages in the formation of fan-out packages from the dies bonded to the die attach film in accordance with some embodiments.

In a subsequent step, as shown in FIG. 6, molding material 41, which may be a molding compound (such as a polymer) is used to mold dies 22 therein. The respective step is illustrated as step 208 in the process flow 200 shown in FIG. 20. A planarization step such as a Chemical Mechanical Polish (CMP) is then performed to planarize the top surface of molding material 41 to be coplanar with the top surfaces of dies 22. Furthermore, electrical connectors 23 of dies 22 are exposed after the planarization step.

FIG. 6 further illustrates the formation of dielectric layers 38, Redistribution Lines (RDLs) 40, and electrical connectors 42. The respective step is also illustrated as step 208 in the process flow 200 shown in FIG. 20. In accordance with some embodiments of the present disclosure, dielectric layers 38 are formed of a polymer, which may also be a photo-sensitive material such as polybenzoxazole (PBO), polyimide, or the like, that can be easily patterned using a photo lithography process. In accordance with alternative embodiments, dielectric layers 38 are formed of a nitride such as silicon nitride, an oxide such as silicon oxide, PhosphoSilicate Glass (PSG), BoroSilicate Glass (BSG), Boron-doped PhosphoSilicate Glass (BPSG), or the like. RDLs 40 may be formed of aluminum, copper, aluminum copper, nickel, gold, palladium, or the like. Electrical connectors 42 may include solder regions, metal pillars capped with solder layers, or the like. RDLs 40 are electrically coupled to electrical connectors 23, which are further electrically coupled to the integrated circuit devices in dies 22.

The structure shown in FIG. 6 is referred to as a fan-out structure, wherein RDLs 40 and electrical connectors 42 extend beyond the footprint of the respective dies 22. Alternatively stated, RDLs 40 and electrical connectors 42 extend to regions beyond the edges of the respective dies 22, so that electrical connectors 42 may have larger pitches than electrical connectors 23. The bonding of the respective package including die 22 is thus easier than the direct bonding of dies 22, whose electrical connectors have smaller pitches. Throughout the description, dies 22, molding material 41, and the overlying dielectric layers 38, RDLs 40, and electrical connectors 42 are collectively referred to as composite wafer 100.

Figure 7:
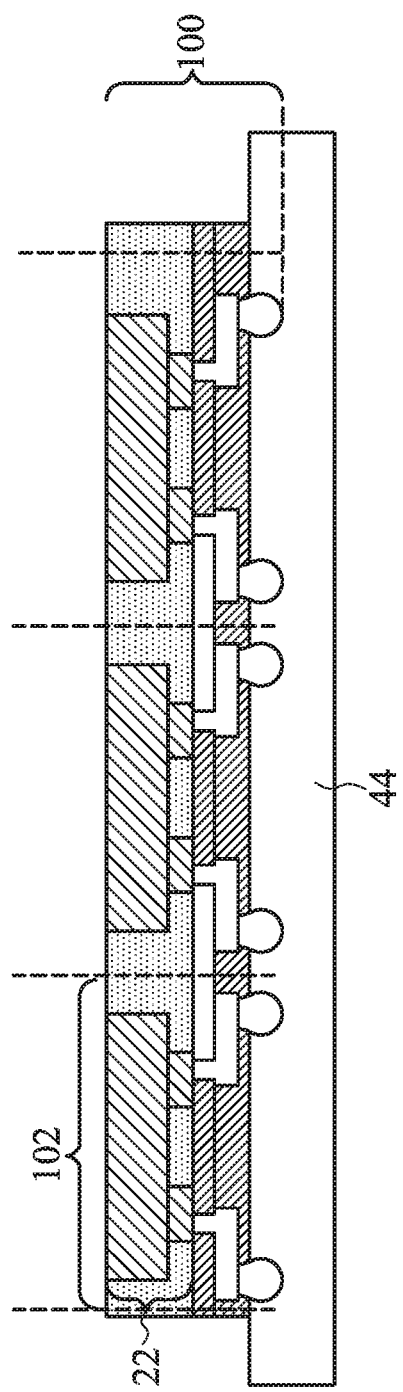

FIG. 7 illustrates the adhering of dicing tape 44 to electrical connectors 42. DAF 30 and carrier wafer 28 as shown in FIG. 6 are then released from dies 22, for example, by projecting a light (not shown) on DAF 30, so that the heat of the light decomposes DAF 30, and hence DAF 30 and carrier wafer 28 are no longer adhered to carrier wafer 28. The respective step is illustrated as step 210 in the process flow 200 shown in FIG. 20. Subsequently, composite wafer 100 is sawed apart in a die-saw process to form a plurality of fan-out packages 102. The respective step is illustrated as step 212 in the process flow 200 shown in FIG. 20. Each of the fan-out packages 102 includes one of dies 22 and the overlying RDLs.

In accordance with some embodiments of the present disclosure, the bonding process as shown in FIGS. 2A, 2B, and 3-5 may be performed using bonder 120 as shown in FIG. 8. Referring to FIG. 8, bonder 120 includes wafer loading port 122, which is configured to load wafer 24 into bonder 120. For example, wafer 24 may be stored in and transported using wafer cassette 124, which may store a plurality of sawed wafers 24. After wafer cassette 124 is connected to bonder 120, wafer 24 is loaded into bonder 120 through loading port 122.

Bonder 120 further includes carrier loading port 126, which is configured to load carrier wafer 28 and DAF 30 into bonder 120. Pick and place unit 132 is configured to pickup dies 22 (FIGS. 2A and 2B) and place dies 22 onto carrier wafer 28. The pick and place head 32/32A/32B as shown in FIGS. 2A and 2B are parts of the pick and place unit 132. In FIG. 8, the dashed box 32 is illustrated to represent that pick and place head 32 picks up die 22 from wafer 24, and the solid box 32 is illustrated to represent the placement of die 22 onto carrier wafer 28/DAF 30. After all usable dies 22 on wafer 24 is placed on carrier wafer 28, the underlying tape 20 is unloaded, and another wafer 24 is loaded in.

Figure 9:
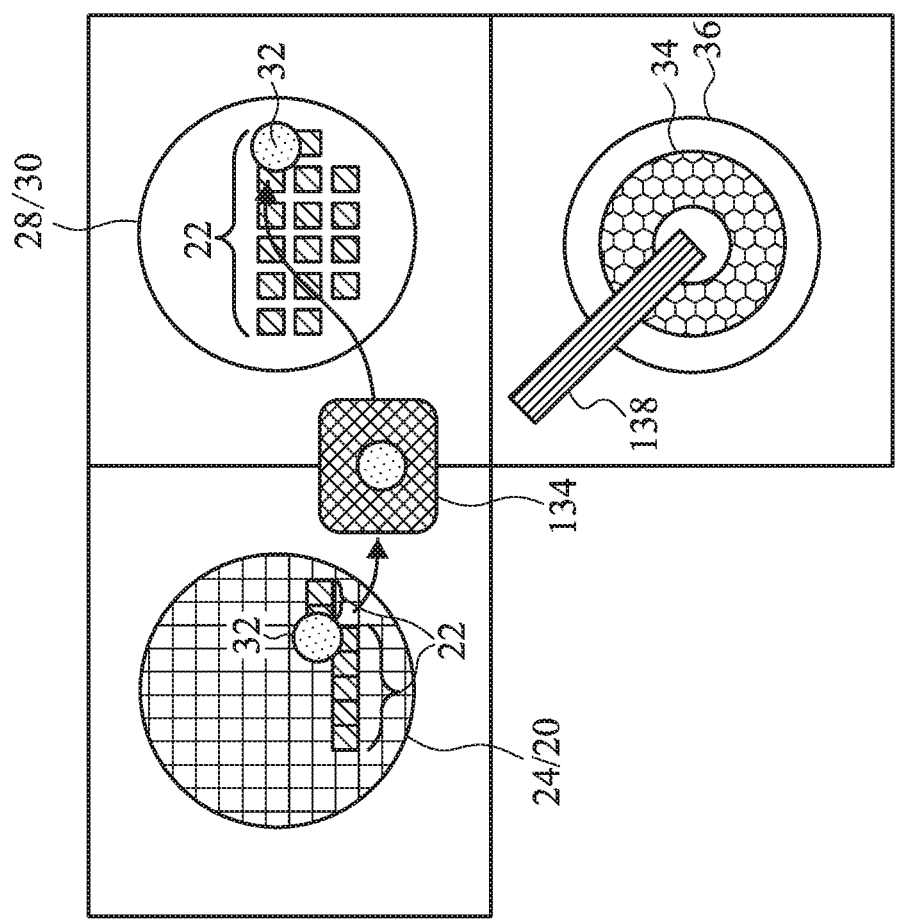
FIGS. 9 through 12 illustrate portions of the bonder and the operation in accordance with some embodiments.

Alignment unit 134 is disposed in bonder 120, and is used for aligning dies 22, so that dies 22 may be accurately placed to their intended positions. FIG. 9 illustrates a simplified view of portions of bonder 120, wherein alignment element 134 and the transferring of dies 22 are illustrated. Alignment unit 134 is configured to find alignment marks (not shown) in dies 22, and pick and place unit 130 then moves dies 22 according to the results of the alignment to place dies 22 on carrier wafer 28/DAF 30.

Figure 10:
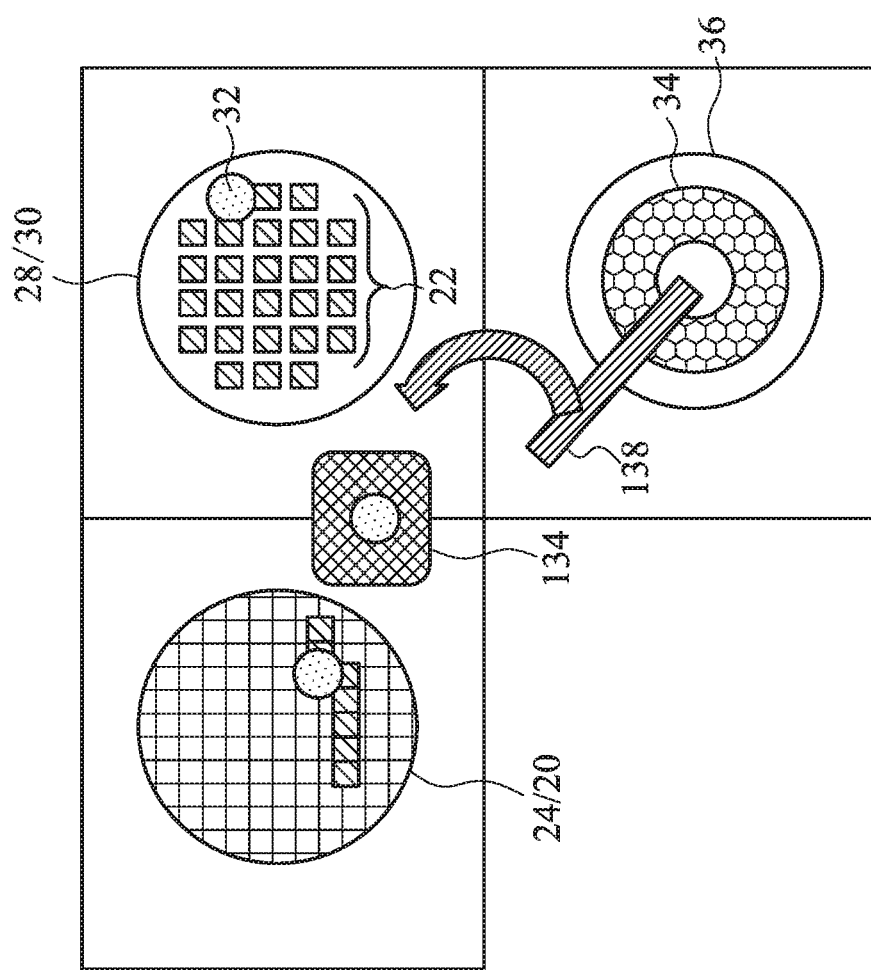
Figure 11:
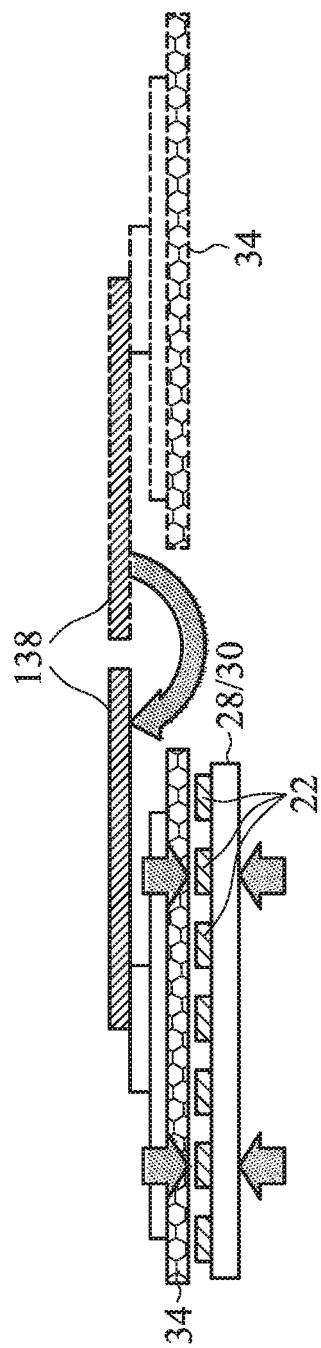

Referring back to FIG. 8, in accordance with some embodiments of the present disclosure, hot plate 34 is disposed inside bonder 120, and is connected to transfer arm unit 136, which is configured to move hot plate 34 toward and away from carrier wafer 28 and the overlying placed dies 22. In accordance with some embodiments of the present disclosure, transfer arm unit 136 includes swivel arm 138 configured to swivel hot plate 34 back and forth between its illustrated position and carrier wafer 28. FIG. 10 illustrates a simplified view of portions of bonder 120, wherein the swivel of swivel arm 138 is illustrated using an arrow. When dies 22 are being placed onto DAF 30, hot plate 34 is located at its illustrated position in FIG. 10. When the placement of dies 22 is finished, swivel arm 138 is swiveled to move hot plate 34 over dies 22, so that hot plate 34 may be brought into contact with dies 22, and hence dies 22 is bonded to DAF 30. After the bonding, swivel arm 138 is swiveled to move hot plate 34 back to the illustrated position in FIG. 8. FIG. 11 illustrates a cross-sectional view of the bonding process, wherein swivel arm 138 and hot plate 34 are moved from the location illustrated using dashed patterns to the location illustrated using solid patterns, so that dies 22 are bonded to DAF 30/carrier wafer 28.

Figure 13:
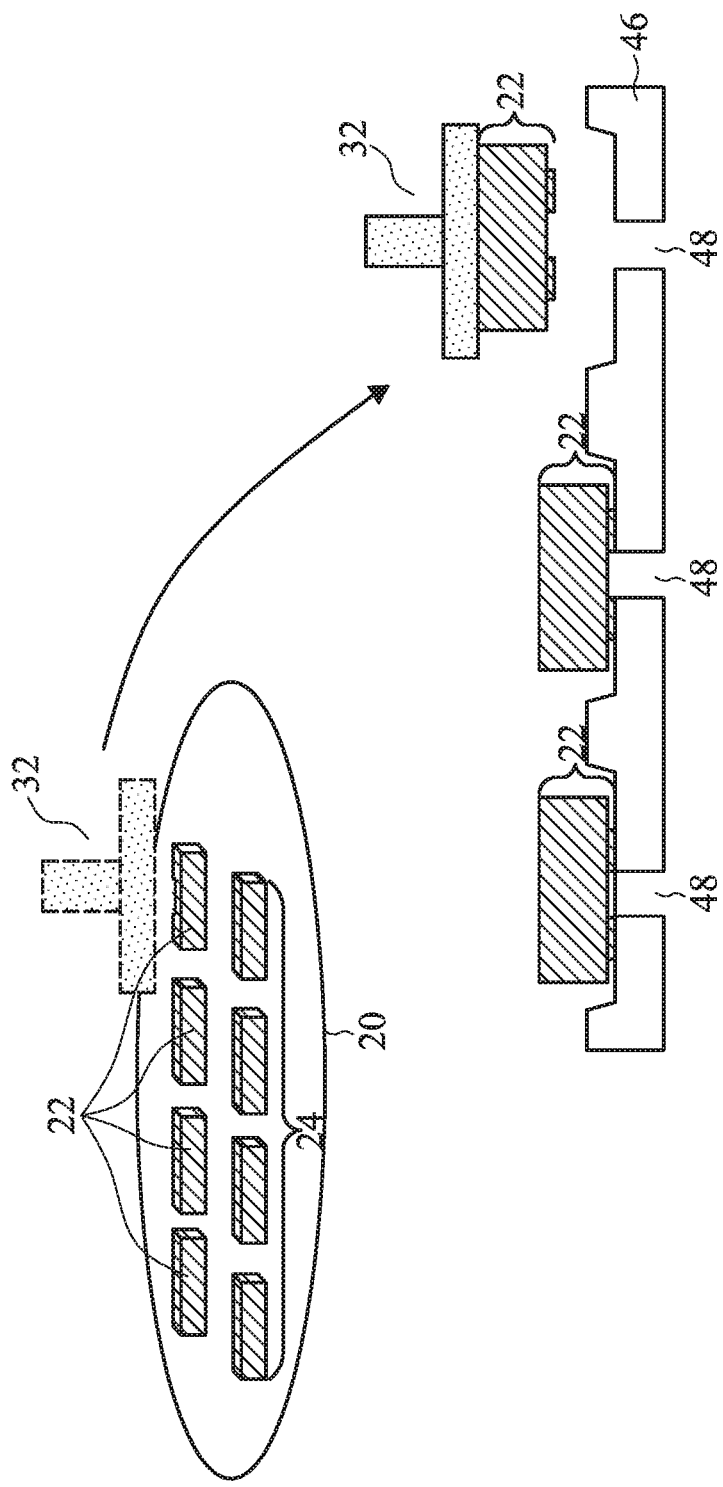
FIGS. 13 through 16 illustrate the cross-sectional views of intermediate stages in the bonding of dies to a die attach film in accordance with some embodiments, wherein a vacuum die holder is used as a temporary die holder.
Figure 14:
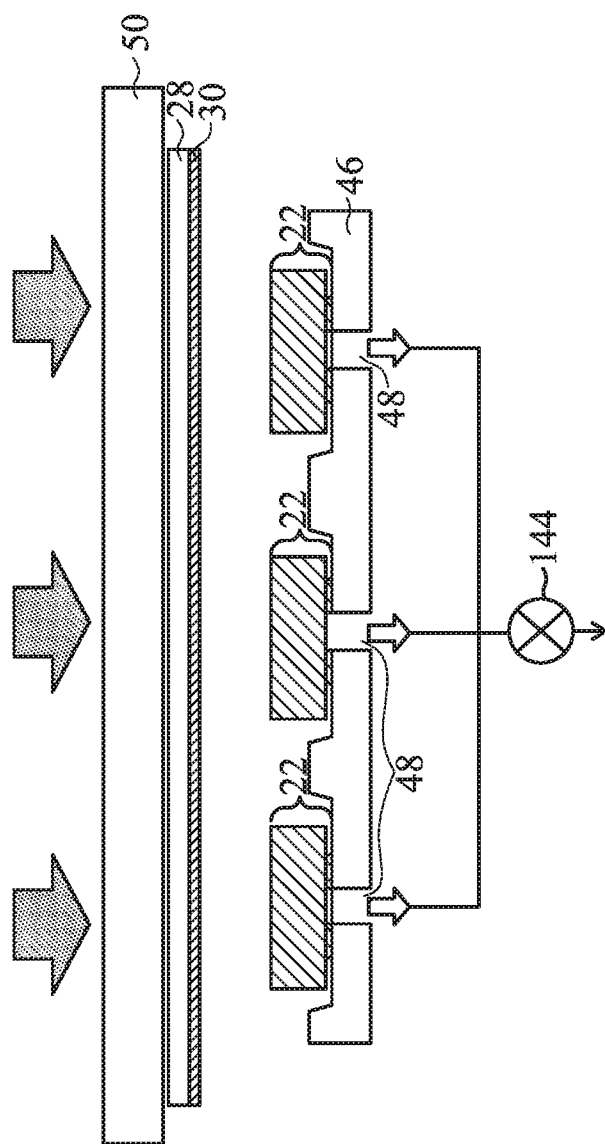
Figure 15:
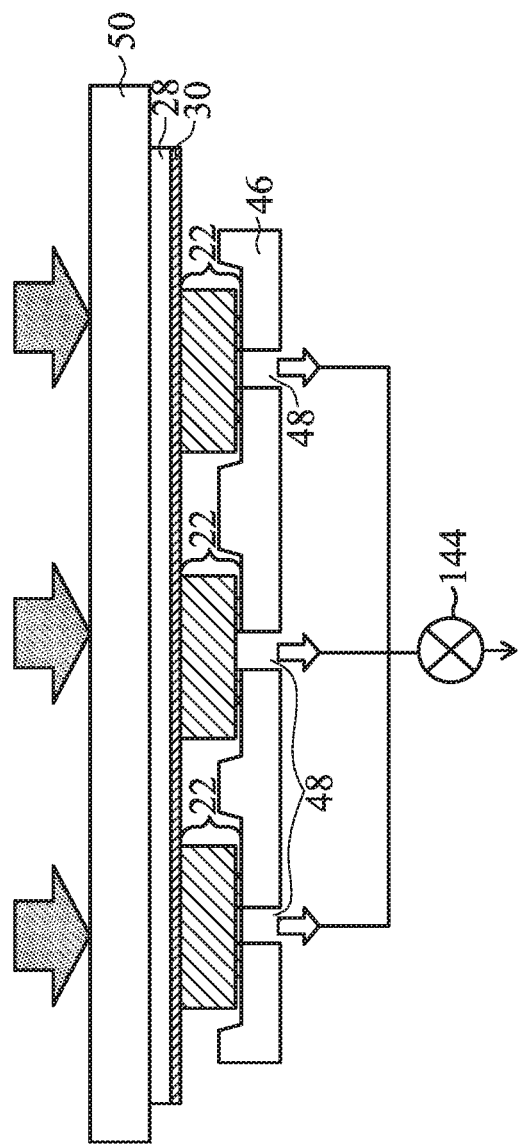
Figure 16:
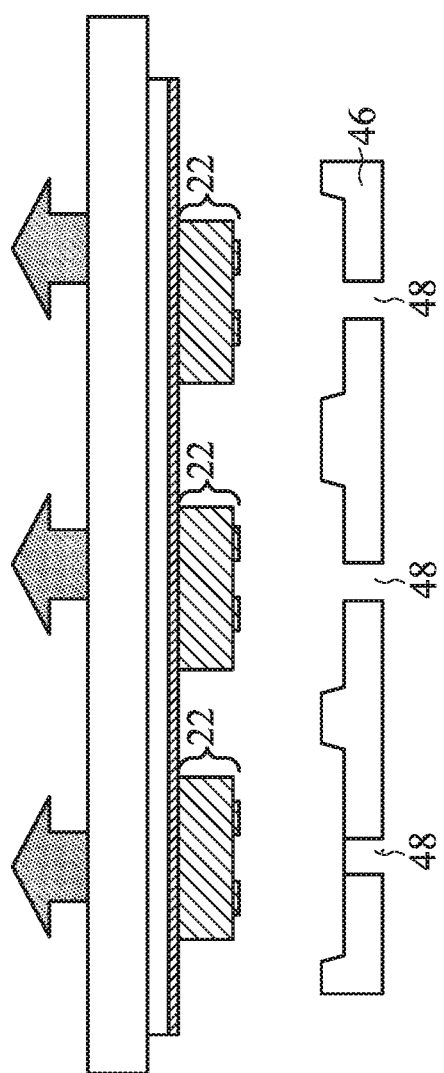
Figure 17:
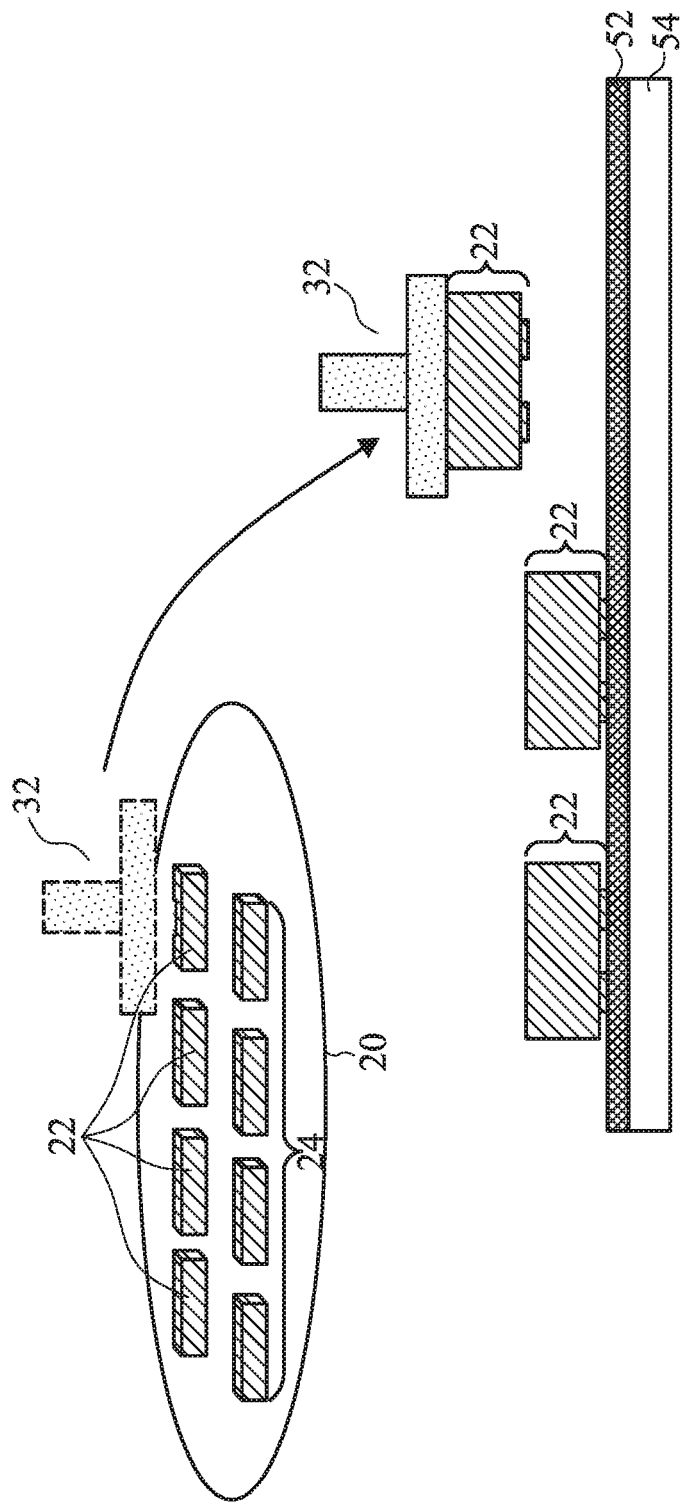
FIGS. 17 through 19 illustrate the cross-sectional views of intermediate stages in the bonding of dies to a die attach film in accordance with some embodiments, wherein an adhesive tape is used as a temporary die holder.
Figure 18:
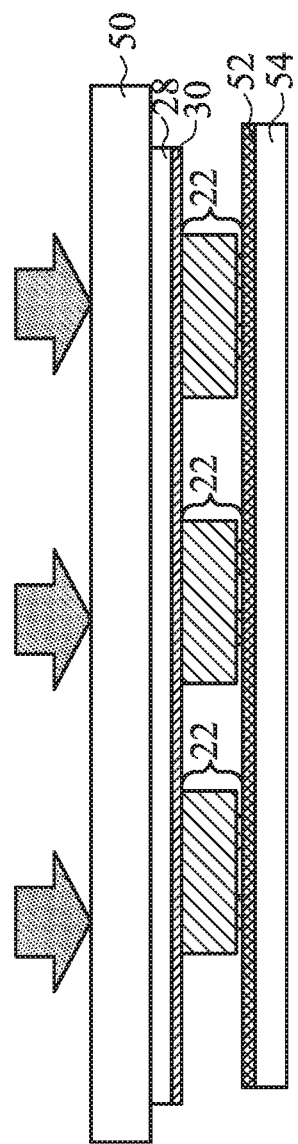

In alternative embodiments, bonder 120 is configured to perform the task shown in FIGS. 13 through 19, for example, with hot plate 34 being a vacuum head 50 configured to pick up and heat carrier wafer 28, as shown in FIGS. 15 and 18. The details will be discussed in subsequent paragraphs. In these embodiments, dies 22 will be transferred to vacuum die holder 46 (FIG. 13) or adhesive tape 52 (FIG. 17).

In accordance with some embodiments of the present disclosure, heating unit 36 is embedded in hot plate 34, as also shown in FIG. 4. In these embodiments, hot plate 34 is heated by heating unit 36, which may heat hot plate 34 during, and between, the bonding processes. In alternative embodiments, heating unit 36 (FIG. 8) is outside of hot plate 34, and hot plate 34 is placed on heating unit 36 to be heated to a desirable temperature. In the bonding process, hot plate 34 is moved to dies 22 to bond dies 22, during which heating unit 36 remains not moved, and hence during the bonding process, hot plate 34 is not heated by heating unit 36. After the heating process, hot plate 34 moves back to be heated by heating unit 36.

Referring back to FIG. 8, after the bonding, the bonded dies 22 and the respective underlying DAF 30 and carrier wafer 28 are unloaded out of bonder 120, for example, through loading port 126.

In accordance with alternative embodiments of the present disclosure, after all dies 22 are placed onto DAF 30, but before the bonding through heating and pressing, dies 22 and the underlying DAF 30 and carrier wafer 28 are unloaded out of bonder 120. The bonding, which includes heating and pressing, of dies 22 to DAF 30 is performed by an external hot plate 34 outside of bonder 120.

As shown in FIG. 8, bonder 120 includes central control unit 142, which is connected to, and is configured to control and coordinate the functions of, all units of bonder 120 including wafer loading port 122, carrier loading port 126, transfer arm unit 136, etc.

Figure 12:
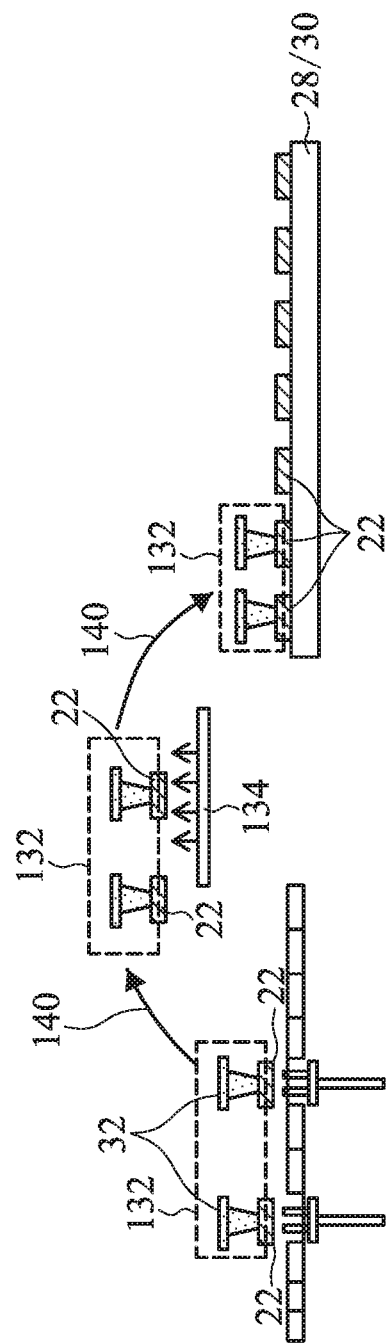

In accordance with some embodiments of the present disclosure, as shown in FIG. 12, a multi-head pick and place unit 132 may be used to pick up multiple dies 22 simultaneously. Multi-head pick and place unit 132 includes a plurality of pick and place head 32, which may be vacuum heads. Each of the pick and place head 32 is configured to pick and place one of dies 22. Arrows 140 represent that multi-head pick and place unit 132 moves as an integrated unit to alignment unit 134, and then places dies 22 onto DAF 30/carrier wafer 28. Advantageously, since the relative positions of dies 22 picked up by multi-head pick and place unit 132 can be controlled, the alignment may be performed on a single one, and not all of, the picked up dies 22. This may significantly improve the throughput. Alternatively, the alignment is performed on all of the dies 22 that are picked up by pick and place unit 132.

FIGS. 13 through 16 illustrate cross-sectional views of intermediate stages in the formation of a bonding process in accordance with alternative embodiments. Unless specified otherwise, the materials and the formation methods of the components in these embodiments are essentially the same as the like components, which are denoted by like reference numerals in the embodiments shown in FIGS. 1 through 8. The details regarding the process and the materials of the components shown in FIGS. 13 through 16 (and FIGS. 17 through 19) may thus be found in the discussion of the embodiments shown in FIGS. 1 through 12.

Referring to FIG. 13, dies 22 are transferred from sawed wafer 24 to vacuum die holder 46, which acts as a temporary die holder. Vacuum die holder 46 may be formed of a metal such as aluminum, copper, stainless steel, or the like, or another material such as ceramic. A plurality of through-holes 48 is disposed to penetrate through the bottom panel of vacuum die holder 46. Each of dies 22 may be aligned to one or a plurality of holes 48 after being placed on vacuum die holder 46.

Referring to FIG. 14, through-holes 48 may be connected to pump 144. After all dies 22 are placed, the internal spaces in through-holes 48 are vacuumed by pump 144 to generate a suction force, and hence dies 22 are fixed to vacuum die holder 46 by the suction force. In these embodiments, dies 22 have their front surface facing vacuum die holder 46.

Next, also referring to FIG. 14, vacuum head 50 is used to pick up carrier wafer 28 and DAF 30, with DAF 30 facing dies 22. Vacuum head 50 is also a hot plate that heats carrier wafer 28 and DAF 30, so that DAF 30 is heated to a desirable temperature, which may be higher than about 50° C., and may be in the range between about 50° C. and about 200° C. Dies 22 may or may not be heated by vacuum die holder 46. DAF 30 is then brought into contact with the back surfaces of dies 22, as shown in FIG. 15. A pressing force may also be applied, for example, for a period of time between about 0.5 seconds and about 2 seconds, so that dies 22 are bonded to DAF 30.

Next, the vacuuming of through-holes 48 is stopped, so that dies 22 are released from vacuum die holder 46. Vacuum head 50 may then pick up carrier wafer 28, DAF 30, and the dies 22 attached thereon, as shown in FIG. 16. In subsequent steps, the process shown in FIGS. 6 and 7 may be performed.

Figure 19:
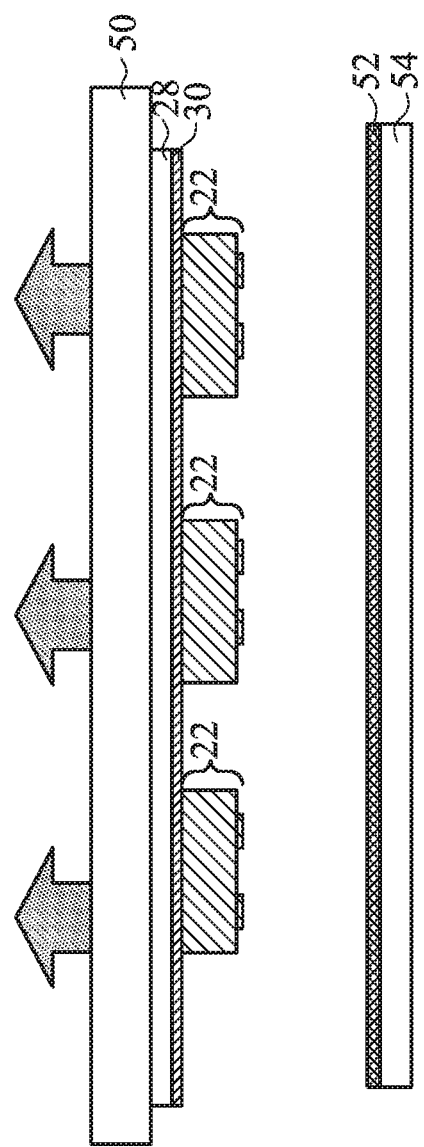

FIGS. 17 through 19 illustrate the cross-sectional views of intermediate stages in the bonding of dies in accordance with yet other embodiments. Referring to FIG. 17, dies 22 are transferred from sawed wafer 24 to adhesive film 52 (which may be a UV tape), which is adhered to temporary substrate 54. Temporary substrate 54 may also be a carrier wafer formed of, for example, glass. The front sides of dies 22 are adhered to UV tape 52. The transferring of dies 22 may be conducted by pick and place head 32, which is not heated in accordance with some embodiments of the present disclosure.

Next, referring to FIG. 18, vacuum head 50 is used to pick up carrier wafer 28 and DAF 30, with DAF 30 facing dies 22. Vacuum head 50 is also a hot plate that heats carrier wafer 28 and DAF 30, so that DAF 30 is heated to a desirable temperature, which may be higher than about 50° C., and may be in the range between about 50° C. and about 200° C. DAF 30 is brought into contact with the back surfaces of dies 22. A pressing force is applied, for example, for a period of time between about 0.5 seconds and about 2 seconds, so that dies 22 are bonded to DAF 30.

Next, adhesive tape 52 and carrier wafer 54 are removed from dies 22, for example, by projecting a UV light on adhesive tape 52, so that adhesive tape 52 loses adhesion, and dies 22 are released from adhesive tape 52. Vacuum head 50 may then pick up carrier wafer 28, DAF 30, and the dies 22 attached thereon. In subsequent steps, the process shown in FIGS. 6 and 7 may be performed.

The embodiments of the present disclosure have some advantageous features. By bonding the dies to the DAF simultaneously, the bonding time is significantly reduced comparing to picking and placing dies, and bonding each of the dies to the DAF separately. The throughput of the bonding process is thus significantly improved.

In accordance with some embodiments of the present disclosure, a method includes bringing into contact respective first sides of a plurality of dies and a die attach film on a major surface of a carrier wafer, and simultaneously heating portions of the die attach film contacting the plurality of dies in order to simultaneously bond the plurality of dies to the die attach film.

In accordance with alternative embodiments of the present disclosure, a method includes placing a plurality of dies to have first surfaces of the plurality of dies coplanar with each other, and heating the plurality of dies or a die attach film using a hot plate, with the hot plate being pressed against the plurality of dies, so that second sides of the plurality of dies are bonded to the die attach film. After the second sides of the plurality of dies are bonded to the die attach film, the hot plate is moved away from the plurality of dies and the die attach film.

In accordance with yet alternative embodiments of the present disclosure, an apparatus for bonding a plurality of dies to a die attach film includes a pick and place unit for placing the plurality of dies, and a heating unit configured to simultaneously bond the plurality of dies to the die attach film by heating portions of the die attach film in contact with the plurality of dies simultaneously.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for attaching a plurality of dies to a die-attach-film, the apparatus comprising:
   a pick-and-place unit for placing the plurality of dies laterally adjacent to each other on a first surface;
   a heating unit configured to hold a carrier substrate with the die-attach-film, the heating unit being configured to heat the die-attach-film; and
   a transfer arm configured to transfer the heating unit to the plurality of dies, wherein the heating unit has the carrier substrate and the die-attach-film attached thereto during the transfer, the transfer arm being configured to simultaneously attach the plurality of dies to the die-attach-film.

2. The apparatus of claim 1, wherein the heating unit comprises a hot plate comprising a planar surface configured to contact the plurality of dies simultaneously.

3. The apparatus of claim 1, wherein the heating unit comprises a hot plate configured to contact a back surface of the carrier substrate, and wherein the plurality of dies is attached to a front side of the carrier substrate with the die-attach-film.

4. The apparatus of claim 1 further comprising an alignment unit configure to align a pick-and-place head to the plurality of dies.

5. The apparatus of claim 1 further comprising a multi-head pick-and-place unit configured to pick-and-place more than one of the plurality of dies simultaneously.

6. The apparatus of claim 1 further comprising a first loading port configured to load a sawed wafer that comprises the plurality of dies into the apparatus.

7. The apparatus of claim 6 further comprising a second loading port configured to load the carrier substrate and the die-attach-film that is attached to the carrier substrate into the apparatus.

8. An apparatus for attaching a plurality of dies to a die-attach-film, the apparatus comprising:
   a first loading port configured to load a carrier and a die-attach film on the carrier to a first position inside a bonder;
   a second loading port configured to load a sawed wafer comprising the plurality of dies to a second position inside the bonder;
   a pick-and-place head configured to pick up the plurality of dies from the sawed wafer at the second position and place the plurality of dies laterally adjacent to each other at a third position;
   a vacuum head comprising a heating unit; and
   a transfer arm unit configured to swivel the vacuum head to and away from the third position, the vacuum head having the carrier and the die-attach film while the vacuum head is swiveled to and away from the third position.

9. The apparatus of claim 8 further comprising an alignment unit configured to align the pick-and-place head with the plurality of dies.

10. The apparatus of claim 8, wherein the heating unit is large enough to simultaneously heat all of the plurality of dies that are placed to the third position.

11. The apparatus of claim 8, wherein the heating unit is configured to heat the die-attach film to a temperature in a range between about 50° and about 200° C.

12. The apparatus of claim 8 further comprising a control unit signally connected to the first loading port, the second loading port, the heating unit, the transfer arm unit, and the pick-and-place head.

13. The apparatus of claim 12, wherein the control unit is configured to coordinate actions of the first loading port, the second loading port, the heating unit, the transfer arm unit, and the pick-and-place head.

14. The apparatus of claim 8, wherein the pick-and-place head is configured to pick-and-place a single one of the plurality of dies at a time.

15. The apparatus of claim 8, wherein the pick-and-place head is configured to pick-and-place multiple ones of the plurality of dies at a time.

16. An apparatus for attaching a plurality of dies to a die-attach-film, the apparatus comprising:
   a first space in a bonder, the first space is configured to hold a carrier and a die-attach film on the carrier;
   a second space in the bonder, the second space is configured to hold a plurality of dies;
   a pick-and-place head configured to transfer the plurality of dies from the second space to a third space; and a heating unit configured to, after the plurality of dies are transferred, heating the die-attach film and simultaneously placing the die-attach film on top of the plurality of dies.

17. The apparatus of claim 16 further comprising a loading port configured to:
   load the carrier and the die-attach film to the first space; and
   unload the carrier, the die-attach film, and the plurality of dies.

18. The apparatus of claim 16 further comprising a control unit configured to control actions of the pick-and-place head and the heating unit.

19. The apparatus of claim 16, wherein the third space comprises a vacuum die holder with a plurality of recesses, wherein the pick-and-place head places the plurality of dies in corresponding ones of the recesses in the vacuum die holder.

20. The apparatus of claim 1, wherein the first surface is a surface of an adhesive.

* * * * *